United States Patent

Yoshimura et al.

(10) Patent No.: US 7,749,681 B2
(45) Date of Patent: Jul. 6, 2010

(54) COMPOSITION FOR FORMING LOWER LAYER FILM AND PATTERN FORMING METHOD

(75) Inventors: Nakaatsu Yoshimura, Tokyo (JP); Yousuke Konno, Tokyo (JP); Hikaru Sugita, Tokyo (JP); Junichi Takahashi, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 12/282,599

(22) PCT Filed: Mar. 14, 2007

(86) PCT No.: PCT/JP2007/055147

§ 371 (c)(1), (2), (4) Date: Nov. 13, 2008

(87) PCT Pub. No.: WO2007/105776

PCT Pub. Date: Sep. 20, 2007

(65) Prior Publication Data

US 2009/0098486 A1 Apr. 16, 2009

(30) Foreign Application Priority Data

Mar. 14, 2006 (JP) ............... 2006-068525

(51) Int. Cl.
- *G03F 7/00* (2006.01)
- *G03F 7/004* (2006.01)
- *G03F 7/11* (2006.01)

(52) U.S. Cl. .............. 430/270.1; 430/322; 430/330; 430/331; 430/905

(58) Field of Classification Search .............. 430/270.1, 430/273.1, 905, 330, 331, 322
See application file for complete search history.

(56) References Cited

U.S. PATENT DOCUMENTS

| | | | |
|---|---|---|---|
| 6,045,968 | A | 4/2000 | Ushirogouchi et al. |
| 2006/0234158 | A1* | 10/2006 | Hatakeyama ............ 430/270.1 |
| 2008/0096125 | A1* | 4/2008 | Kim et al. ............... 430/270.1 |
| 2008/0153033 | A1* | 6/2008 | Hyung et al. ............ 430/281.1 |
| 2008/0160461 | A1* | 7/2008 | Yoon et al. .............. 430/323 |

FOREIGN PATENT DOCUMENTS

| | | |
|---|---|---|
| JP | 61-130947 | 6/1986 |
| JP | 2000-143937 A | 5/2000 |
| JP | 2001-40293 A | 2/2001 |
| JP | 2002-014474 | 1/2002 |
| JP | 2002-14474 A | 1/2002 |
| JP | 2004-205676 | 7/2004 |
| JP | 2004-205676 A | 7/2004 |
| JP | 2004-205685 | 7/2004 |
| JP | 2004-205685 A | 7/2004 |
| JP | 2005-15532 A | 1/2005 |
| JP | 2005-114921 A | 4/2005 |
| JP | 2006-293207 A | 10/2006 |
| WO | WO 2008/038544 A1 | 4/2008 |

OTHER PUBLICATIONS

Machine translation of JP 2004-205676.*
Machine translation of JP 2002-14474.*
Machine translation of JP 2005-114921.*

* cited by examiner

*Primary Examiner*—Amanda C. Walke
(74) *Attorney, Agent, or Firm*—Ditthavong Mori & Steiner, P.C.

(57) ABSTRACT

A composition for forming a lower layer film comprises a polymer (A) having a naphthalene derivative structural unit shown by the following formula (1),

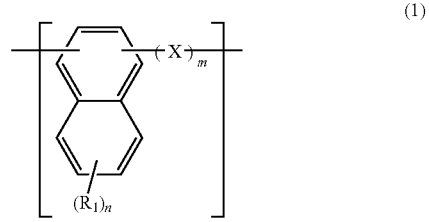

wherein $R_1$ represents a hydroxyl group and the like, X represents a substitutable alkylene group having 1 to 20 carbon atoms and the like, n represents 0 to 6, m represents 1 to 8, and n+m represents an integer from 1 to 8, provided that two or more $R_1$s may be the same or different and two or more Xs may be the same or different.

12 Claims, No Drawings

COMPOSITION FOR FORMING LOWER LAYER FILM AND PATTERN FORMING METHOD

TECHNICAL FIELD

The present invention relates to a composition for forming a resist lower layer film and to a pattern forming method. More particularly, the present invention relates to a composition for forming a resist lower layer film containing a polymer which has a naphthalene derivative structure and suitable for use in micro-fabrication in a lithography process using various types of radiation, particularly for manufacturing highly integrated circuit elements, and to a pattern forming method.

BACKGROUND ART

A multilayer resist process is used for manufacturing integrated circuit elements in order to obtain a higher degree of integration. The multilayer resist process can achieve micro-fabrication. In this process, a composition for forming a lower layer in the form of a liquid is first applied to a substrate and cured to obtain a resist lower layer film. Then, a liquid photo resist composition is applied to the resist lower layer film. Next, a photoresist pattern is obtained by transferring a mask pattern and is developed with an appropriate developer using a reduced projection exposure system (stepper). The pattern is transferred to a resist lower layer film by dry etching. The resist lower layer pattern is finally transferred to a substrate by dry etching. A substrate with a desired pattern can be obtained in this manner. A multilayer process may be called a two-layer resist process if one resist lower layer film is used, and a three-layer resist process if two resist lower layer films are used.

Generally, the resist lower layer film functions as an antireflection film which absorbs radiation reflected by a substrate, and it is common to use a material having a large carbon content. A resist lower layer film with a large carbon content can improve etching selectivity during substrate processing, ensuring a more exact pattern transfer. A thermosetting phenol novolak resin is a well known resist lower layer film. A composition containing a polymer having an acenaphthylene skeleton is also known as a resist lower layer film exhibiting good characteristics (for example, refer to Patent Documents 1 and 2).

Patent Document 1: JP-A-2000-143937

Patent Document 2: JP-A-2001-40293

DISCLOSURE OF THE INVENTION

However, further downsizing of etching patterns is demanded in order to obtain a higher degree of integration. In order to attain this demand, overetching and interskimming produced in the above-mentioned resist lower layer film have been nonnegligible problems. For this reason, development of a resist lower layer film which exhibits a more precise pattern-transfer performance, etching selectivity, and interskimming prevention effect has been desired.

Therefore, the present invention provides a composition for forming a lower layer film which can form a good resist lower layer film having not only a function of an antireflection film, but also excellent pattern transfer performance, etching selectivity, and superior intermixing prevention effect, and a pattern forming method using the composition for forming a lower layer film.

As a result of extensive studies in order to develop such a composition for forming a lower layer film and a pattern forming method, the inventors of the present invention have found that a naphthalene derivative is very useful as a compound exhibiting the above-mentioned characteristics in the composition for forming lower layer film and the composition exhibits high etching selectivity, a superior antireflection effect (pattern transfer performance), and an excellent intermixing prevention effect as compared with general compositions for forming a lower layer film. This finding has led to the completion of the present invention.

Specifically, the present invention provides the following composition for forming a lower layer film and the following pattern forming method.

[1] A composition for forming a lower layer film comprising a polymer (A) having a naphthalene derivative structural unit shown by the following formula (1),

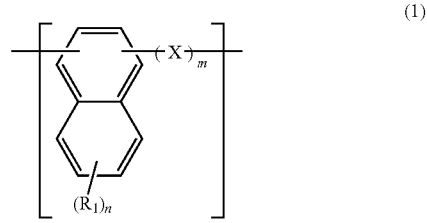

wherein $R_1$ represents a hydroxyl group, a substitutable alkyl group having 1 to 6 carbon atoms, a substitutable alkoxy group having 1 to 6 carbon atoms, a substitutable alkoxycarbonyl group having 2 to 10 carbon atoms, a substitutable aryl group having 6 to 14 carbon atoms, or a substitutable glycidyl ether group having 2 to 6 carbon atoms, n represents an integer from 0 to 6, X represents a methylene group, a substitutable alkylene group having 2 to 20 carbon atoms, a substitutable arylene group having 6 to 14 carbon atoms, or an alkylene ether group, and m represents an integer from 1 to 8, provided that two or more $R_1$s may be the same or different when n is 2 to 6, two or more Xs may be the same or different when m is 2 to 8, and n+m is an integer from 1 to 8.

[2] The composition for forming a lower layer film according to [1], wherein $R_1$, in the above formula (1) has a structure shown by the following formula (2).

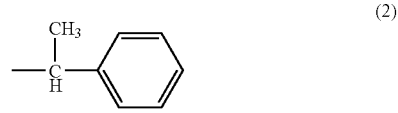

[3] The composition for forming a lower layer film according to [2], wherein X in the above formula (1) has a structure shown by the following formula (3) and/or (4).

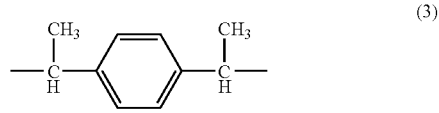

-continued

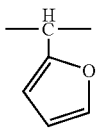
(4)

[4] The composition for forming a lower layer film according to [3], further comprising an acid generating agent (C).
[5] The composition for forming a lower layer film according to [3], further comprising a cross-linking agent (D).
[6] The composition for forming a lower layer film according to [3], further comprising an additive (B).
[7] A pattern forming method comprising a step of forming a resist lower layer film by applying the composition for forming a lower layer film according to any one of [1] to [6] to a substrate and curing the resulting coating film, a step of forming a resist film by applying a solution of a resist composition to the resist lower layer film and prebaking the resulting coating film, a step of selectively exposing the resist film through a photomask, a step of developing the exposed resist film, and a step of etching the resist lower layer film and the substrate.

The composition for forming a lower layer film of the present invention can produce a lower layer film which not only has a function of an antireflection film, but also exhibits excellent pattern transfer performance, etching selectivity, and a superior intermixing prevention effect.

The pattern forming method of the present invention can form a resist lower layer film having not only a function of an antireflection film, but also an excellent pattern transfer performance, etching selectivity, and a superior intermixing prevention effect.

BEST MODE FOR CARRYING OUT THE INVENTION

Preferred embodiments of the present invention are described below. Note that the present invention is not limited to the following embodiments. Various modifications and improvements may be made on the embodiments without departing from the scope of the present invention based on the knowledge of a person skilled in the art.

The composition for forming a lower layer film of the present invention comprises a polymer (A) having a naphthalene derivative structural unit shown by the following formula (1) (hereinafter referred to as "polymer (A)"),

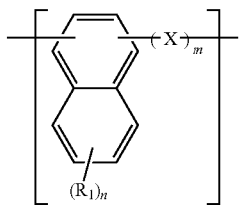
(1)

wherein $R_1$ represents a hydroxyl group, a substitutable alkyl group having 1 to 6 carbon atoms, a substitutable alkoxy group having 1 to 6 carbon atoms, a substitutable alkoxycarbonyl group having 2 to 10 carbon atoms, a substitutable aryl group having 6 to 14 carbon atoms, or a substitutable glycidyl ether group having 2 to 6 carbon atoms, n represents an integer from 0 to 6, X represents a methylene group, a substitutable alkylene group having 2 to 20 carbon atoms, a substitutable arylene group having 6 to 14 carbon atoms, or an alkylene ether group, and m represents an integer from 1 to 8, provided that two or more $R_1$s may be the same or different when n is 2 to 6, two or more Xs may be the same or different when m is 2 to 8, and n+m is an integer from 1 to 8.

Polymer (A):

The polymer (A) is a polymer having a naphthalene derivative structural unit (hereinafter referred to as "structural unit (a)").

Naphthalene Derivative Structural Unit:

The structural unit (a) has a substituent $R_1$ and a substituent X. The substituent $R_1$ is a hydroxyl group, a substitutable alkyl group having 1 to 6 carbon atoms, a substitutable alkoxy group having 1 to 6 carbon atoms, a substitutable alkoxycarbonyl group having 2 to 10 carbon atoms, a substitutable aryl group having 6 to 14 carbon atoms, or a substitutable glycidyl ether group having 2 to 6 carbon atoms. And so, n is an integer from 0 to 6. When n is 2 to 6, two or more substituents $R_1$s may be the same or different.

A monovalent atom or an organic group other than a hydrogen atom represented by the substituent $R_1$ may be an alkenyl group, a nitro group, an amino group, an acyl group, a carboxyl group, a sulfonic acid group, a mercapto group, a hydroxymethyl group, an ester group, an epoxy group, or the like.

As the alkyl group, a linear or a branched alkyl group having 1 to 6 carbon atoms is preferable. For example, a methyl group, an ethyl group, a propyl group, an isopropyl group, a butyl group, an isobutyl group, a tert-butyl group, and the like can be given.

As the alkenyl group, a linear or a branched alkenyl group having 2 to 6 carbon atoms is preferable. For example, a vinyl group, an alyl group, and the like can be given.

As the acyl group, an aliphatic or an aromatic acyl group having 1 to 6 carbon atoms is preferable. For example, an acetyl group and the like can be given.

As the amino group, a primary amino group is preferable.

Among these, a hydroxyl group and the aryl group are more preferable. An aryl group having a structural unit shown by the following formula (2) (hereinafter referred to as "structural unit (b)") is preferable.

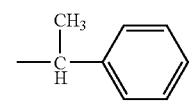
(2)

As examples of X in the structural unit (a), an alkylene group, an arylene group, an alkylene ether group, and the like can be given.

As the alkylene group, a substitutable alkylene group having 1 to 20 carbon atoms is preferable. For example, a methylene group, an ethylene group, and the like can be given.

As the arylene group, a substitutable arylene group having 6 to 14 carbon atoms is preferable. For example, a phenylene group, a naphthalene group, and the like can be given. And so, m is an integer from 1 to 8. When m is 2 to 8, two or more Xs may be the same or different. Above mentioned n+m is an integer from 1 to 8.

As the substituent X, a group having a structure shown by the following formula (3) (hereinafter referred to as "structural unit (c)") and/or a group having a structure shown by the following formula (4) (hereinafter referred to as "structural unit (d)") is particularly preferable.

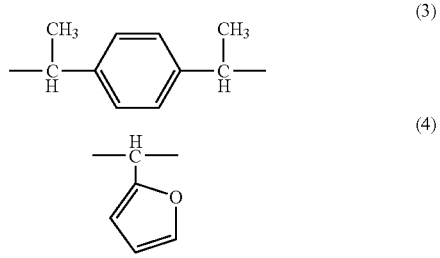

The amount of the structural unit (a) is preferably 30 to 300 mol %, and more preferably 50 to 100 mol % of the total amount of the polymer (A). If the amount of the structural unit (a) is less than 30 mol %, the molecular weight is too large, and applicability of the composition for forming a lower layer film tends to decrease. If more than 300 mol %, on the other hand, the molecular weight is too small, and striations may be created when the composition for a lower layer film is spin-coated.

The polystyrene-converted weight average molecular weight (hereinafter referred to "Mw") determined by gel permeation chromatography (GPC) of the polymer (A) is preferably 500 to 8000, more preferably 1000 to 3000, and particularly preferably 1500 to 2500. If Mw is less than 500, the desired film thickness may not be obtained due to evaporation of the components when baking a film. If Mw is more than 8000, solubility of the solvent may decrease.

The polymer (A) preferably contains a structural unit (a) having the structural unit (b) as the substituent $R_1$ (hereinafter referred to as "polymer (A-1)"), a structural unit (a) having the structural unit (c) and the structural unit (d) as the substituent X (hereinafter referred to as "polymer (A-2)"), a structural unit (b) as the substituent $R_1$ and the structural unit (c) and the structural unit (d) as the substituent X (hereinafter referred to as "polymer (A-3)"), and the like.

Polymer (A-2):

For example, the polymer (A-2) may be synthesized by the following step (i) or (ii). The step (i) is single condensation of a naphthalene derivative and an aldehyde in the presence of an acid catalyst or cocondensation of a naphthalene derivative and an aldehyde with other cocondensable components. The step (ii) is single condensation of a naphthalene derivative and a divinyl compound in the presence of an acid catalyst or cocondensation of a naphthalene derivative and a divinyl compound with other cocondensable components.

Examples of the cocondensable components (compounds) include styrene and substituted styrenes such as α-methylstyrene, o-methylstyrene, m-methylstyrene, p-methylstyrene, o-hydroxystyrene, m-hydroxystyrene, p-hydroxystyrene, o-acetoxystyrene, m-acetoxystyrene, p-acetoxystyrene, and p-t-buthoxystyrene; carboxylic vinyl ester compounds such as vinyl acetate, vinyl propionate, and vinyl caproate; vinyl cyanide compounds such as (meth)acrylonitrile, and α-chloroacrylonitrile; unsaturated carboxylic ester compounds such as methyl (meth)acrylate, ethyl (meth)acrylate, n-propyl (meth)acrylate, n-butyl (meth)acrylate, n-hexyl (meth)acrylate, and glycidyl (meth)acrylate; unsaturated group-containing unsaturated carboxylic ester such as ethylene glycol di(meth)acrylate, propylene glycol di(meth)acrylate, vinyl (meth)acrylate, and dimethylvinylmethacryloyloxymethylsilane; halogen-containing vinyl compounds such as 2-chloroethyl vinyl ether, vinyl chloroacetate, and allyl chloroacetate; hydroxyl group-containing vinyl compounds such as 2-hydroxyethyl (meth)acrylate, 2-hydroxypropyl (meth)acrylate, and (meth)allyl alcohol; amide group-containing vinyl compounds such as (meth)acrylamide and crotonic acid amide; carboxyl group-containing vinyl compounds such as 2-methacryloyloxyethyl succinic acid and 2-methacryloyloxyethyl maleic acid; and vinyl aryl compounds such as 1-vinylnaphthalene, 2-vinylnaphthalene, 9-vinyl anthracene, and 9-vinylcarbazole.

The amount of the cocondensable component (compound) is preferably 5 to 100 mol %, more preferably 10 to 100 mol %, and still more preferably 20 to 100 mol % of the total amount of the structural unit (a) forming the polymer (A) and the cocondensable component (compound).

The steps (i) and (ii) are described below in more detail.

Step (i):

Examples of the aldehydes include saturated aliphatic aldehydes such as formaldehyde, paraformaldehyde, acetaldehyde, and propylaldehyde; unsaturated aliphatic aldehydes such as acrolein and metacrolein; hetero-cyclic aldehydes such as furfural; and aromatic aldehydes such as benzaldehyde, naphthylaldehyde, and anthraaldehyde. Formaldehyde, paraformaldehyde, and furfural are particularly preferable. These compounds may be used individually or in combination of two or more.

The amount of the aldehydes used for the condensation reaction is preferably 1 to 10,000 parts by mass, and particularly preferably 30 to 120 parts by mass for 100 parts by mass of the naphthalene derivative.

The aromatic hydrocarbons (hereinafter referred to as "aromatic compounds") may be added as the other cocondensation components during the condensation reaction. In this case, the aromatic compounds are used with the naphthalene derivative as reaction components. This condensation reaction is carried out by mixing the naphthalene derivative, the aromatic compounds, and the aldehydes, and heating the mixture in the presence of an acid catalyst in a solvent or without using a solvent.

As the aromatic compounds, any aromatic compounds may be used insofar as the aromatic compounds are copolycondensable with the naphthalene derivative. Examples of the aromatic compounds include unsubstituted aromatic hydrocarbons such as benzene, naphthalene, anthracene, phenanthrene, and acenaphthene; alkyl-substituted aromatic hydrocarbons such as toluene, m-xylene, p-xylene, and 1-methylnaphthalene; hydroxy-substituted aromatic hydrocarbons such as phenol, cresol, 1-naphtol, bisphenol, and polyhydric phenol; carboxyl-substituted aromatic hydrocarbons such as benzoic acid, 1-naphthalenecarboxylic acid, and 9-anthracenecarboxylic acid; amino-substituted aromatic hydrocarbons such as aniline; and halogenated aromatic hydrocarbons such as chlorobenzene and bromobenzene. These compounds may be used individually or in combination of two or more.

The amount of the aromatic compounds and the aldehydes used for the condensation reaction is preferably 10,000 parts by mass or less of the aromatic compounds and 1 to 1000 parts by mass of the aldehydes for 100 parts by mass of the naphthalene derivative.

Examples of the acid catalyst used for the condensation reaction include mineral acid such as sulfuric acid, phosphoric acid, and perchloric acid; organosulfonic acid such as p-toluene sulfonic acid; and carboxylic acid such as formic acid and oxalic acid. The amount of the acid catalyst is selected according to the type of the acid. For example, the amount of the acid catalyst used for 100 parts by mass of acenaphthylenes is preferably 0.001 to 10,000 parts by mass, and particularly preferably 0.01 to 1000 parts by mass.

The reaction temperature during condensation is preferably 40 to 200° C. The reaction time is selected according to the reaction temperature, preferably from a range of 30 minutes to 72 hours. The Mw of the polymer (A) obtained by the above method is preferably 1,000 to 1,000,000, and particularly preferably 5,000 to 500,000.

Step (ii):

Examples of the divinyl compounds include divinylbenzene, dicyclopentadiene, tetrahydroindene, 4-vinylcyclohexene, 5-vinylnorborn-2-ene, α-pinene, β-pinene, limonene, and 5-vinylnorbornadiene. Divinylbenzene is particularly preferable. These compounds may be used individually or in combination of two or more.

The amount of the divinyl compounds used for the condensation reaction is usually 1 to 10,000 parts by mass, and preferably 30 to 120 parts by mass for 100 parts by mass of the naphthalene derivative.

The aromatic hydrocarbons may be added as the other cocondensation components during the condensation reaction. In this case, the aromatic compound is used with the naphthalene derivative as a reaction component. This condensation reaction is carried out by mixing the naphthalene derivative, the aromatic compound, and the divinyl compound, and heating the mixture in a solvent or without using a solvent in the presence of an acid catalyst.

As mentioned in the step (i), any aromatic compound may be used insofar as the aromatic compounds are copolycondensable with the naphthalene derivative. The same compounds given in the step (i) may be given as examples of the aromatic compounds. Those compounds may be used individually or in combination of two or more.

The amount of the aromatic compounds and the aldehydes used for the condensation reaction is preferably 10,000 parts by mass or less of the aromatic compounds and 1 to 1000 parts by mass of the aldehydes for 100 parts by mass of the naphthalene derivative.

Examples of the acid catalyst used for the condensation reaction include mineral acid such as sulfuric acid, phosphoric acid, and perchloric acid; organosulfonic acid such as p-toluene sulfonic acid; carboxylic acid such as formic acid and oxalic acid. The amount of the acid catalyst is selected according to the type of the acid in a range preferably of 0.001 to 10,000 parts by mass, and particularly preferably of 0.01 to 1000 parts by mass for 100 parts by mass of acenaphthylenes.

The reaction temperature during condensation is preferably 40 to 200° C. The reaction time is selected according to the reaction temperature preferably in a range from 30 minutes to 72 hours. The Mw of the polymer (A) obtained by the above method is preferably 1,000 to 1,000,000, and particularly preferably 5,000 to 500,000.

The total amount of the structural units (c) and (d) in the polymer (A-2) is preferably 5 to 100 mol %, and more preferably 10 to 50 mol % of the amount of the structural unit (a). If the amount is less than 5 mol %, the amount of unreacted naphthalene derivatives may increase, and the yield tends to be poor. If the amount is more than 100 mol %, a large amount of monomers tend to remain unreacted. The amount of the structural unit (d) is preferably 50 to 100 mol % of the amount of the structural unit (c).

Polymer (A-1):

The polymer (A) may also be synthesized by a step of reacting the naphthalene ring of the naphthalene derivative and the vinyl compounds which are the cocondensable components with the naphthalene derivative, in the presence of an acid catalyst (hereinafter referred to as "step (iii)"). According to the step (iii), the polymer (A) may have the substituent $R_1$ having a structural unit derived from a vinyl compound.

Examples of the vinyl compound include vinylbenzene, divinylbenzene, dicyclopentadiene, tetrahydroindene, 4-vinylcyclohexene, 5-vinylnorborn-2-ene, α-pinene, β-pinene, limonene, butadiene, and the like.

The polymer (A-1) may be synthesized if vinylbenzene is used as the vinyl compound in the step (iii).

The amount of the structural unit (b) in the polymer (A-1) is preferably 10 to 100 mol %, and more preferably 20 to 50 mol % of the amount of the structural unit (a). If the amount is less than 10 mol %, the amount of unreacted naphthalene derivatives may increase, and the yield tends to be poor. If the amount is more than 100 mol %, a large amount of monomers tend to remain unreacted.

Polymer (A-3):

The polymer (A-3) may be synthesized by, for example, the steps (i) and (iii), or the steps (ii) and (iii), or the steps (i), (ii), and (iii). There are no particular limitations to the order of the steps (i), (ii), and (iii). The total amount of the structural units (b), (c), and (d) in the polymer (A-3) is preferably 10 to 100 mol %, and more preferably 20 to 50 mol % of the amount of the structural unit (a). If the amount is less than 10 mol %, unreacted naphthalene derivatives may increase, and the yield tends to be poor. If the amount is more than 100 mol %, a large amount of monomers tend to remain unreacted. The amount of the structural unit (d) is preferably 50 to 100 mol % of the amount of the structural unit (c).

Polymer (A-4)

When the substituent $R_1$ is a hydroxyl group, there is a step of reacting the naphthalene ring of the naphthalene derivative and a difunctional epoxy compound in the presence of an acid catalyst to obtain a polymer (A) containing the substituent X having a structure shown by the following formula (5) (hereinafter referred to as "step (iv)").

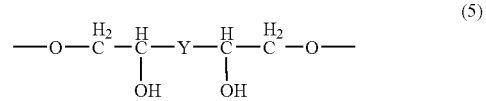

(5)

wherein Y represents a methylene group, a substitutable alkylene group having 2 to 20 carbon atoms, or a substitutable arylene group having 6 to 14 carbon atoms.

The difunctional epoxy compounds are compounds having at least two epoxy groups in a molecule. Examples of commercially available products include bisphenol A epoxy resins such as Epicoat 1001, Epicoat 1002, Epicoat 1003, Epicoat 1004, Epicoat 1007, Epicoat 1009, Epicoat 1010, and Epicoat 828 (trade name; manufactured by Yuka-Shell Epoxy Co., Ltd.); bisphenol F epoxy resins such as Epicoat 807 (trade name; manufactured by Yuka-Shell Epoxy Co., Ltd.); phenol novolak epoxy resins such as Epicoat 152 and Epicoat 154 (trade name; manufactured by Yuka-Shell Epoxy Co., Ltd.), EPPN 201 and EPPN 202 (trade name; manufactured by Nippon Kayaku Co., Ltd.); cresol novolak epoxy resins such as EOCN 102, EOCN 103S, EOCN 104S, EOCN 1020, EOCN 1025, and EOCN 1027 (trade name; manufactured by Nippon Kayaku Co., Ltd.), and Epicoat 180S75 (trade name; manufactured by Yuka-Shell Epoxy Co., Ltd.); polyphenol epoxy resins such as Epicoat 1032H60 and Epicoat XY-400

(trade name; manufactured by Yuka-Shell Epoxy Co., Ltd.); cyclic aliphatic epoxy resins such as CY-175, CY-177, CY-179, Araldite CY-182, Araldite CY-192, and Araldite CY-184 (trade name; manufactured by Ciba Geigy Corp.), ERL-4234, ERL-4299, ERL-4221, and ERL-4206 (trade name; manufactured by U.C.C.), Shodine 509 (trade name; manufactured by Showa Denko K. K.), EPICLON 200 and EPICLON 400 ((trade name; manufactured by Dainippon Ink and Chemicals), Epicoat 871 and Epicoat 872 (trade name; manufactured by Yuka-Shell Epoxy Co., Ltd.), and ED-5661 and ED-5662 (trade name; manufactured by Celanese Coatings); and aliphatic polyglycidyl ether such as Epolight 100 MF (manufactured by Kyceisha Yushi Kagaku Kogyo Co., Ltd) and EPIOL TMP (manufactured by NOF Corporation).

The composition for forming a lower layer film of the present invention contains the polymer (A). The composition is preferably a liquid containing a solvent in which the polymer (A) is dissolved. The amount of the polymer (A) contained in the composition for forming a lower layer film of the present invention is preferably 8 to 30 mass %, and more preferably 10 to 15 mass %.

Solvent:

There are no particular limitations to the solvent used in the composition for forming a lower layer film of the present invention insofar as the solvent can dissolve the polymer (A) Examples of the solvent include ethylene glycol monoalkyl ethers such as ethylene glycol monomethyl ether, ethylene glycol monoethyl ether, ethylene glycol mono-n-propyl ether, and ethylene glycol mono-n-butyl ether; ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; diethylene glycol dialkyl ethers such as diethylene glycol dimethyl ether, diethylene glycol diethyl ether, diethylene glycol di-n-propyl ether, and diethylene glycol di-n-butyl ether; triethylene glycol dialkyl ethers such as triethylene glycol dimethyl ether and triethylene glycol diethyl ether;

propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate;

lactic acid esters such as methyl lactate, ethyl lactate, n-propyl lactate, i-propyl lactate, n-butyl lactate, and i-butyl lactate; aliphatic carboxylic acid esters such as methyl formate, ethyl formate, n-propyl formate, i-propyl formate, n-butyl formate, i-butyl formate, n-amyl formate, i-amyl formate, methyl acetate, ethyl acetate, n-propyl acetate, i-propyl acetate, n-butyl acetate, i-butyl acetate, n-amyl acetate, i-amyl acetate, n-hexyl acetate, methyl propionate, ethyl propionate, n-propyl propionate, i-propyl propionate, n-butyl propionate, i-butyl propionate, methyl butyrate, ethyl butyrate, n-propyl butyrate, i-propyl butyrate, n-butyl butyrate, and i-butyl butyrate;

other esters such as ethyl hydroxylacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxy propylacetate, 3-methoxy butylacetate, 3-methyl-3-methoxybutyl acetate, 3-methyl-3-methoxybutyl propionate, 3-methyl-3-methoxybutyl butyrate, methyl acetoacetoate, methyl pyruvate, and ethyl pyruvate; aromatic hydrocarbons such as toluene and xylene; ketones such as methyl ethyl ketone, methyl n-propyl ketone, methyl n-butyl ketone, 2-heptanone, 3-heptanone, 4-heptanone, and cyclohexanone; amides such as N-methyl formamide, N,N-dimethyl formamide, N-methyl acetamide, N,N-dimethyl acetamide, and N-methyl pyrrolidone; and lactones such as γ-butyrolactone. These compounds may be appropriately selected and used as the solvent.

Among these solvents, propylene glycol monomethyl ether, ethylene glycolmonoethyl ether acetate, ethyl lactate, n-butyl acetate, ethyl 3-ethoxypropionate, methyl 3-methoxypropionate, 2-heptanone, cyclohexanone, and γ-butyrolactone are preferable. These solvents may be used individually or in combination of two or more.

The solvent is used in an amount to make the solid content of the composition preferably 5 to 80 mass %, more preferably 5 to 40 mass %, and particularly preferably 10 to 30 mass %.

It is preferable that the composition for forming a lower layer film of the present invention further contain, as required, an acid generating agent (C), a cross-linking agent (D), and an additive (B) to an extent not impairing the effect of the present invention. As examples of the additive (B), a binder resin, a radiation absorber, a surfactant, and the like can be given.

Acid Generating Agent (C):

The acid generating agent (C) is a component which generates acid by exposure to radiation or heating.

Examples of acid generating agents which generate an acid by exposure to radiation (hereinafter referred to as "photoacid generating agent") include: an onium salt photoacid generating agent such as diphenyliodonium trifluoromethanesulfonate, diphenyliodonium nonafluoro-n-butanesulfonate, diphenyliodonium pyrenesulfonate, diphenyliodonium n-dodecylbenzenesulfonate, diphenyliodonium 10-camphorsulfonate, diphenyliodonium naphthalenesulfonate, diphenyliodonium hexafluoroantimonate, bis(4-t-butylphenyl)iodonium trifluoromethanesulfonate, bis(4-t-butylphenyl)iodonium nonafluoro-n-butanesulfonate, bis(4-t-butylphenyl)iodonium n-dodecylbenzenesulfonate, bis(4-t-butylphenyl)iodonium 10-camphorsulfonate, bis(4-t-butylphenyl)iodonium naphthalenesulfonate, triphenylsulfonium trifluoromethanesulfonate, bis(4-t-butylphenyl)iodonium hexafluoroantimonate, triphenylsulfonium nonafluoro-n-butanesulfonate, triphenylsulfonium n-dodecylbenzenesulfonate, triphenylsulfonium naphthalenesulfonate, triphenylsulfonium 10-camphorsulfonate, triphenylsulfonium hexafluoroantimonate, 4-hydroxyphenyl.phenyl.methylsulfonium p-toluenesulfonate, 4-hydroxyphenyl.benzyl.methylsulfonium p-toluenesulfonate, cyclohexyl.methyl.2-oxocyclohexylsulfonium trifluoromethanesulfonate, 2-oxocyclohexyldicyclohexylsulfonium trifluoromethanesulfonate, 2-oxocyclohexyldimethylsulfonium trifluoromethanesulfonate, 1-naphtyldimethylsulfonium trifluoromethanesulfonate, 1-naphtyldiethylsulfonium trifluoromethanesulfonate, 4-cyano-1-naphtyldimethylsulfonium trifluoromethanesulfonate, 4-cyano-1-naphtyldiethylsulfonium trifluoromethanesulfonate, 4-nitro-1-naphtyldimethylsulfonium trifluoromethanesulfonate, 4-nitro-1-naphtyldiethylsulfonium trifluoromethanesulfonate, 4-methyl-1- naphtyldimethylsulfonium trifluoromethanesulfonate, 4-methyl-1-naphtyldiethylsulfonium trifluoromethanesulfonate, 4-hydroxy-1-naphtyldimethylsulfonium trifluoromethanesulfonate, 4-hydroxy-1-naphtyldiethylsulfonium trifluoromethanesulfonate, 1-(4-hydroxynaphthalen-1-yl)tetrahydrothiophenium trifluoromethanesulfonate, 1-(4-methoxynaphthalen-1-yl)tetrahydrothiophenium trifluoromethanesulfonate, 1-(4-ethoxynaphthalen-1-yl)tetrahydrothiophenium trifluoromethanesulfonate, 1-(4-methoxymethoxynaphthalen-1-yl)tetrahydrothiophenium trifluoromethanesulfonate, 1-(4-ethoxymethoxynaphthalen-1-yl)tetrahydrothiophenium trifluoromethanesulfonate, 1-[4-(1-methoxyethoxy)naphthalen-1-yl]tetrahydrothiophenium trifluoromethanesulfonate, 1-[4-(2-methoxyethoxy)naphthalen-1-yl]tetrahydrothiophenium trifluoromethanesulfonate, 1-(4-methoxycarbonyloxynaphthalen-1-yl)tetrahydrothiophenium trifluoromethanesulfonate, 1-(4-ethoxycarbonyloxynaphthalen-1-yl)tetrahydrothiophenium trifluoromethanesulfonate, 1-(4-n-propoxycarbonyloxynaphthalen-1-yl)tetrahydrothiophenium trifluoromethanesulfonate, 1-(4-i-propoxycarbonyloxynaphthalen-1-yl)tetrahydrothiophenium trifluoromethanesulfonate, 1-(4-n-butoxycarbonyloxynaphthalen-1-yl)tetrahydrothiophenium trifluoromethanesulfonate, 1-(4-t-butoxycarbonyloxynaphthalen-1-yl)tetrahydrothiophenium trifluoromethanesulfonate, 1-[4-(2-tetrahydrofuranyloxy)naphthalen-1-yl] tetrahydrothiophenium trifluoromethanesulfonate, 1-[4-(2-tetrahydropyranyloxy)naphthalen-1-yl] tetrahydrothiophenium trifluoromethanesulfonate, 1-(4-benzyloxy)tetrahydrothiophenium trifluoromethanesulfonate, and 1-(naphthylacetomethyl)tetrahydrothiophenium trifluoromethanesulfonate;

a halogen-containing compound photoacid generating agent such as phenylbis(trichloromethyl)-s-triazine, 4-methoxyphenylbis(trichloromethyl)-s-triazine, and 1-naphthylbis(trichloromethyl)-s-triazine;

a diazoketone compound photoacid generating agent such as 1,2-naphthoquinonediazido-4-sulfonylchloride, 1,2-naphthoquinonediazido-5-sulfonylchloride, and 1,2-naphthoquinonediazido-4-sulfonate or 1,2-naphthoquinonediazido-5-sulfonate of 2,3,4,4'-tetrahydroxybenzophenone;

a sulfone compound photoacid generating agent such as 4-trisphenacylsulfone, mesitylphenacylsulfone, and bis(phenylsulfonyl)methane; and a sulfonic acid compound photoacid generating agent such as benzointosylate, tris(trifluoromethanesulfonate) of pyrogallol, nitrobenzyl-9,10-diethoxyanthracene-2-sulfonate, trifluoromethanesulfonyl bicyclo[2,2,1]hept-5-ene-2,3-dicarbodiimide, N-hydroxysuccinimide trifluoromethanesulfonate, 1,8-naphthalenedicarboxylic acid imide trifluoromethanesulfonate.

Among these photoacid generating agents, diphenyliodonium trifluoromethanesulfonate, diphenyliodonium nonafluoro-n-butanesulfonate, diphenyliodonium pyrenesulfonate, diphenyliodonium n-dodecylbenzenesulfonate, diphenyliodonium 10-camphorsulfonate, diphenyliodonium naphthalenesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium n-dodecylbenzenesulfonate, bis(4-t-butylphenyl)iodonium 10-camphorsulfonate, bis(4-t-butylphenyl)iodonium naphthalenesulfonate, and the like are preferable. These photoacid generating agents may be used either individually or in combination of two or more.

Examples of acid generating agents which generate an acid upon heating (hereinafter referred to as "thermal acid generating agent") include 2,4,4,6-tetrabromocyclohexadienone, benzointosylate, 2-nitrobenzyltosylate, alkyl sulfonates and the like. These thermal acid generating agents may be used either individually or in combination of two or more. A photoacid generating agent and a thermal acid generating agent may be used in combination as the acid generating agent.

The amount of the acid generating agent is preferably 5000 parts by mass or less, more preferably 0.1 to 1000 parts by mass, and particularly preferably 0.1 to 100 parts by mass for 100 parts by mass of the solid content of the composition for forming a lower layer film. The cross-linking reaction may be carried out effectively between the molecular chains of polymers at a comparatively low temperature (including room temperature) by adding the photoacid generating agent and/or the thermal acid generating agent to the composition for forming a lower layer film of the present invention.

Cross-Linking Agent (D):

The cross-linking agent (D) is a component having a function of preventing intermixing between the resist lower layer film obtained by curing the composition for forming a lower layer film and the resist film formed on the resist lower layer film, as well as a function of preventing the resist lower layer film from cracking. As the cross-linking agent, polynuclear phenols and various commercially available curing agents may be used.

Examples of the polynuclear phenols include binuclear phenols such as 4,4'-biphenyldiol, 4,4'-methylenebisphenol, 4,4'-ethylidenebisphenol, and bisphenol A; trinuclear phenols such as 4,4',4''-methylidenetrisphenol, and 4,4'-[1-{4-(1-[4-hydroxyphenyl]-1-methylethyl)phenyl}ethylidene] bisphenol; and polyphenols such as novolak; and the like. Among these polynuclear phenols, 4,4'-[1-{4-(1-[4-hydroxyphenyl]-1-methylethyl)phenyl}ethylidene]bisphenol, novolak, and the like can be given. These polynuclear phenols may be used either individually or in combination of two or more.

Examples of the curing agents include diisocyanates such as 2,3-tolylenediisocyanate, 2,4-tolylenediisocyanate, 3,4-tolylenediisocyanate, 3,5-tolylenediisocyanate, 4,4'-diphenylmethanediisocyanate, hexamethylenediisocyanate, and 1,4-cyclohexanediisocyanate, and epoxy compounds available under the trade names of Epicoat 812, Epicoat 815, Epicoat 826, Epicoat 828, Epicoat 834, Epicoat 836, Epicoat 871, Epicoat 1001, Epicoat 1004, Epicoat 1007, Epicoat 1009, and Epicoat 1031 (manufactured by Yuka-Shell Epoxy Co., Ltd.), Araldite 6600, Araldite 6700, Araldite 6800, Araldite 502, Araldite 6071, Araldite 6084, Araldite 6097, and Araldite 6099 (manufactured by Ciba Geigy Corp.), DER 331, DER 332, DER 333, DER 661, DER 644, and DER 667 (manufactured by Dow Chemical Company), and the like; melamine curing agents such as Cymel 300, Cymel 301, Cymel 303, Cymel 350, Cymel 370, Cymel 771, Cymel 325, Cymel 327, Cymel 703, Cymel 712, Cymel 701, Cymel 272, Cymel 202, Mycoat 506, and Mycoat 508 (manufactured by Mitsui-Cyanamid Ltd.); benzoguanamine curing agents such as Cymel 1123, Cymel 1123-10, Cymel 1128, Mycoat 102, Mycoat 105, Mycoat 106, and Mycoat 130 (manufactured by Mitsui-Cyanamid Ltd.); and glycoluril curing agents such as Cymel 1170 and Cymel 1172 (manufactured by Mitsui-Cyanamid Ltd.), and NIKALACN-2702 (manufactured by Sanwa Chemical Co., Ltd.). Among these, melamine curing agents, glycoluril curing agents, and the like are preferable. These curing agents may be used either individually or in combination of two or more. A polynuclear phenol and a curing agent may be used in combination as the cross-linking agent.

The amount of the cross-linking agent is preferably 5000 parts by mass or less, and more preferably 1000 parts by mass or less for 100 parts by mass of the solid content of the composition for forming a lower layer film.

Additive (B):

The additive (B) is a component added to the composition for forming a lower layer film other than the acid generating agent (C) and the cross-linking agent (D). The additive (B) has a function of preventing intermixing between the resist lower layer film and the resist film and improving applicability of the composition for forming a lower layer film. As examples of the additive (B), a binder resin, a radiation absorber, a surfactant, and the like can be given.

Various thermoplastic resins and thermosetting resins may be used as a binder resin. Examples of the thermoplastic resins include α-olefin polymers such as polyethylene, polypropylene, poly-1-butene, poly-1-pentene, poly-1-hexene, poly-1-heptene, poly-1-octene, poly-1-decene, poly-1-dodecene, poly-1-tetradecene, poly-1-hexadecene, poly-1-octadecene, and polyvinyl cycloalkane; non-conjugated diene polymers such as poly-1,4-pentadiene, poly-1,4-hexadiene, and poly-1,5-hexadiene; α,β-unsaturated aldehyde polymers; α,β-unsaturated ketone polymers such as poly(methyl ethyl ketone), poly(aromatic vinyl ketone), and poly(cyclic vinyl ketone); α,β-unsaturated carboxylic acid polymers or α,β-unsaturated carboxylic acid derivative polymers such as polymers of (meth)acrylic acid, α-chloroacrylic acid, (meth)acrylic acid salt, (meth)acrylate, and halogenated (meth) acrylic acid; α,β-unsaturated carboxylic acid anhydride polymers such as a copolymer of poly(meth)acrylic acid anhydride and maleic acid unhydride; unsaturated polybasic calboxylate polymers such as methylene malonic acid diester, and itaconic acid diester;

diolefin carboxylate polymers such as polymers of sorbate and muconate; α,β-unsaturated carboxylic acid thioester polymers such as polymers of (meth)acrylic acid thioester and α-chloroacrylic acid thioester; (meth) acrylonitrile polymers or (meth) acrylonitrile derivative polymers such as polymers of (meth)acrylonitirile and α-chloroacrylonitrile; (meth)acrylamide polymers or (meth)acrylamide derivative polymers such as polymers of (meth) acrylamide and N,N-dimethyl (meth)acrylamide; styryl metal compound polymers; vinyloxy metal compound polymers; polyimines; polyethers such as polyphenylene oxide, poly-1,3-dioxolan, polyoxolan, polytetrahydrofuran, and polytetrahydropyrane; polysulfides; polysulfone amides; polypeptides; polyamides such as nylon 66 and nylons 1 to 12; polyesters such as aliphatic polyesters, aromatic polyesters, alicyclic polyesters, and polycarbonate esters; polyureas; polysulfones; polyazines; polyamines; polyaromatic ketones; polyimides; polybenzoimidazoles; polybenzooxazols; polybenzothiazoles; polyaminotriazoles; polyoxadiazoles; polypyrazoles; polytetrazoles; polyquinoxalines; polytriazines; polybenzooxadinones; polyquinolines; and polyanthrazolines.

The thermosetting resin becomes insoluble in a solvent when cured by heating and has a function of preventing intermixing between the resist lower layer film and the resist film formed on the resist lower layer film. The thermosetting resin is preferably used as a binder resin. As examples of the thermosetting resins, thermosetting acrylic resins, phenol resins, urea resins, melamine resins, amino resins, aromatic hydrocarbon resins, epoxy resins, alkyd resins, and the like can be given. Among these thermosetting resins, urea resins, melamine resins, aromatic hydrocarbon resins, and the like are preferable.

The binder resins may be used either individually or in combination of two or more. The amount of the binder resin is preferably 20 parts by mass or less, and more preferably 10 parts by mass or less for 100 parts by mass of the polymer in the composition for forming a lower layer film.

Examples of the radiation absorber include a dye such as an oil soluble dye, a disperse dye, a basic dye, a methine dye, a pyrazole dye, an imidazole dye, and a hydroxyazo dye; a fluorescent bleach such as a bixin derivative, a norbixin, a stilbene, a 4,4'-diaminostilbene derivative, a cumarin derivative, and a pyrazoline derivative; a UV absorber such as a hydroxyazo dye, Cinubin 234 and Cinubin 1130 (trade name; manufactured by Ciba Geigy Corp.); an aromatic compound such as an anthracene derivative and an anthraquinone derivative; and the like. These radiation absorbers may be used either individually or in combination of two or more. The amount of the radiation absorber is preferably 100 parts by mass or less, and more preferably 50 parts by mass or less for 100 parts by mass of the solid content of the composition for forming a lower layer film.

The surfactant is a component having a function of improving applicability, striation, wettability, developability, and the like. Examples of the surfactant include a nonion surfactant such as polyoxyethylene lauryl ether, polyoxyethylene stearyl ether, polyoxyethylene oleyl ether, polyoxyethylene-n-octyl phenyl ether, polyoxyethylene-n-nonyl phenyl ether, polyethylene glycol dilaurate, and polyethylene glycol distearate, and the surfactants available under the trade names of KP 341 (manufactured by Shin-Etsu Chemical Co., Ltd.), Polyflow No. 75 and Polyflow No. 95 (manufactured by Kyoeisha Chemical Co., Ltd.), FTOP EF101, FTOP EF204, FTOP EF303, and ETOP EF352 (manufactured by Tohkem Products Corporation), MEGAFAC F171, MEGAFAC F172, and MEGAFAC F173 (manufactured by Dainippon Ink and Chemicals, Inc.), Fluorad FC430, Fluorad FC431, Fluorad FC135, and Fluorad FC93 (manufactured by Sumitomo 3M Ltd.); Asahi Guard AG710, Surflon S-382, Surflon SC-101, Surflon SC-102, Surflon SC-103, Surflon SC-104, Surflon SC-105, and Surflon SC-106 (manufactured by Asahi Glass Co., Ltd.), and the like. These surfactants may be used either individually or in combination of two or more. The amount of the surfactant is preferably 15 parts by mass or less, and more preferably 10 parts by mass or less for 100 parts by mass of the solid content of the composition for forming a lower layer film.

Examples of the additives (B) other than the additives described above include preservatives, defoamers, adhesion aids, and the like.

Formation of resist pattern using a resist lower layer film:

The method for forming a resist pattern using the composition for forming a lower layer film of the present invention (hereinafter referred to as "lower layer film composition") comprises:

1) a step of forming a resist lower layer film by applying the lower layer film composition to a substrate and curing the coating film, 2) a step of forming a resist film by applying a solution of the resist composition to the resist lower layer film and prebaking the obtained coating film, 3) a step of selectively exposing the resist film to radiation through a photomask, 4) a step of developing the exposed resist film, and 5) a step of etching the resist lower layer film.

Each step is described below.

1) Resist lower layer film formation step:

For example, a silicon wafer and a wafer covered with aluminum may be used as a substrate. The lower layer film composition may be applied by an appropriate method such as rotation application, cast coating, and roll coating. Then, the coating film may be cured by exposure to radiation and/or heating. The radiation used for exposure is appropriately selected from a visible ray, an ultraviolet ray, a deep ultraviolet ray, an X-ray, an electron beam, a γ ray, a molecular beam, an ion beam, and the like according to the type of the photoacid generating agent to be used. If the lower layer film composition subjected to exposure contains a photoacid generating agent, the coating film may be cured effectively even at a room temperature. The heating temperature is preferably 90 to 350° C., and more preferably 200 to 300° C. If the lower layer film composition contains a thermal acid generating agent, the coating film may be cured effectively at 90 to 150° C., for example. Thickness of the resist lower layer film formed in this step is preferably 0.1 to 5 μm.

2) Resist Film Formation Step:

A solution of the resist composition is applied to the resist lower layer film so that the resist film has a specified thickness. Then, the resist film is formed by prebaking the composition and evaporating the solvent in the coating film. The prebaking temperature is appropriately adjusted according to the type of the resist composition in a range preferably of 30 to 200° C., and more preferably of 50 to 150° C.

Examples of the resist composition include a positive-tone or a negative-tone chemically amplified resist composition containing a photoacid generating agent, a positive-tone resist composition comprising an alkali-soluble resin and a quinondiazido sensitizer, a negative-tone resist composition comprising an alkali-soluble resin and a cross-linking agent, and the like.

The solution of the resist composition used for forming the resist film on the resist lower layer film preferably has a solid content of approximately 5 to 50 mass %. Before forming the resist film, the solution is filtered through a filter having a pore diameter of approximately 0.2 μm, for example. In this step, the commercially available solution of the resist composition may be used as is.

3) Exposure Step:

The radiation used for exposure is appropriately selected from a visible ray, an ultraviolet ray, a deep ultraviolet ray, an X-ray, an electron beam, a γ ray, a molecular beam, an ion beam, and the like according to the type of the photoacid generating agent to be used in the resist composition. A deep ultraviolet ray is preferable and a KrF excimer laser (248 nm), an ArF excimer laser (193 nm), an $F_2$ excimer laser (wavelength of 157 nm), a $Kr_2$ excimer laser (wavelength of 147 nm), an ArKr excimer laser (wavelength of 134 nm), an extreme ultraviolet ray (wavelength of 13 nm), and the like are particularly preferable.

4) Development Step:

The resist film after exposure is developed, washed, and dried to form a specified resist pattern. After exposure and before development, the film may be postbaked to increase resolution, pattern profile, developability, and the like.

The developer used in this step is appropriately selected according to the type of the resist composition. Examples of the developer for the positive-tone chemically amplified resist composition and the positive-tone resist composition containing an alkali-soluble resin include alkaline aqueous solutions such as sodium hydroxide, potassium hydroxide, sodium carbonate, sodium silicate, sodium meta-silicate, ammonia, ethylamine, n-propylamine, diethylamine, di-n-propylamine, triethylamine, methyldiethylamine, dimethyl ethanolamine, triethanolamine, tetramethyl ammonium hydroxide, tetraethyl ammonium hydroxide, paroles, piperidine, choline, 1,8-diazabicyclo[5.4.0]-7-undecene, and 1,5-diazabicyclo[4.3.0]-5-nonene. Moreover, an appropriate amount of a water-soluble organic solvent such as alcohol (e.g. methanol and ethanol) or surfactants can be added to these alkaline aqueous solutions.

5) Etching Step:

The resist lower layer film is dry-etched with gas plasma such as oxygen plasma using the obtained resist pattern as a mask. The specified resist pattern for substrate processing is obtained in this manner.

EXAMPLES

The present invention is described below in detail by way of examples. Note that the present invention is not limited to the following examples. In the examples, "part(s)" means "part(s) by mass" and "%" means "mass %" unless otherwise indicated. Methods for measuring and evaluating various properties and characteristics are as follows. The method of preparing samples used for measurement and performance evaluation is described later.

Optical Characteristics

A resist lower layer film with a thickness of 0.3 μm was prepared by applying the composition for forming a lower layer film to a silicon wafer with a diameter of 8" by spin coating and heating the coating on a hot plate at 300° C. for 120 seconds. The refractive index (n value) and absorbance (k value) at a wavelength of 193 nm of the resist lower layer film were measured using an ellipsometer "VUV-VASE" manufactured by J.A. WOOLLAM.

Pattern Shape after Development

The pattern shape of a resist film prepared from the sample for performance evaluation was evaluated by observation using a scanning electron microscope. The sample was evaluated as "Good" if the pattern shape was rectangle, and as "Bad" if the pattern shape was other than rectangle (for example, T-top, scum, etc.).

Standing-Wave Prevention Effect

The standing-wave prevention effect was evaluated by inspecting the presence or absence of the effect of standing-wave on a resist film prepared from the sample for performance evaluation by observation using a scanning electron microscope. When a standing-wave by reflection from a resist lower layer film is not observed on a pattern side, the standing-wave prevention effect was evaluated as "Good", and otherwise as "Bad".

Intermixing Prevention Effect

For evaluation of the intermixing prevention effect, a resist lower layer film was formed and immersed in cylohexanone at room temperature for one minute to measure the thickness change before and after the immersion. A spectroscopic ellipsometer "UV1280E" (manufactured by KLA-TENCOR) was used for measurement. When no change in the thickness was observed, the intermixing prevention effect was evaluated as "Good", and otherwise as "Bad".

Etching Resistivity

A resist lower layer film was formed in the same manner as in the optical characteristic evaluation, and the film was subjected to an etching process using an etching device ("EXAM" manufactured by Sinko Seiki Co., Ltd.) in $CF_4$/Ar/$O_2$ ($CF_4$: 40 mL/min, Ar: 20 mL/min, $O_2$: 5 mL/min; pressure: 20 Pa; RF power: 200 W; processing time: 40 seconds; temperature: 15° C.). Etching resistivity was calculated from the film thicknesses before and after the etching process.

Synthesis Example 1

Synthesis of Polymer (A-1)

A reactor equipped with a condenser, a thermometer, and a stirrer was charged with 100 parts of 1-naphthol, 100 parts of propylene glycol monomethyl ether acetate, and 50 parts of paraformaldehyde. After the addition of two parts of oxalic acid, the mixture was heated to 120° C. and reacted for five hours while dehydrating. After cooling to 100° C., 1 part of paratoluenesulfonic acid was added. 40 parts of styrene was added dropwise to the reaction mixture at 120° C. over 60 minutes. After allowing the mixture to stand at 120° C. for four hours, the mixture was reacted at 140° C. for two hours to obtain the polymer (A-1).

Synthesis Example 2

Synthesis of Polymer (A-2)

A reactor equipped with a condenser, a thermometer, and a stirrer was charged with 100 parts of 1-naphthol, 100 parts of propylene glycol monomethyl ether acetate, and 1 part of paratoluenesulfonic acid (PTSA). After heating to 120° C., 40 parts of divinylbenzene (DVB) was added at 120° C. over 30 minutes. After allowing the mixture to stand at 120° C. for two hours, the mixture was heated to 140° C. and reacted for three hours. The reaction mixture was then cooled to 100° C., followed by the addition of 1 part of PTSA. Forty parts of styrene was added dropwise to the reaction mixture at 120° C. over 60 minutes. After allowing the mixture to stand at 120° C. for four hours, the mixture was reacted at 140° C. for two hours to obtain the polymer (A-2).

Synthesis Example 3

Synthesis of Polymer (A-3))

A reactor equipped with a condenser, a thermometer, and a stirrer was charged with 100 parts of 1-naphthol, 100 parts of propylene glycol monomethyl ether acetate, and 1 part of paratoluenesulfonic acid (PTSA). After heating to 120° C., 30 parts of divinylbenzene (DVB) and 20 parts of furfural were added dropwise at 120° C. over 30 minutes. After allowing the mixture to stand at 120° C. for two hours, the mixture was heated to 140° C. and reacted for three hours. The reaction mixture was cooled to 100° C., followed by the addition of 1 part of PTSA. Forty parts of styrene was added dropwise to the reaction mixture at 120° C. over 60 minutes. After allowing the mixture to stand at 120° C. for four hours, the mixture was reacted at 140° C. for two hours to obtain the polymer (A-3).

Measurement of Molecular Weight

The Mw of the polymers obtained in Synthesis Examples 1 to 3 was measured by gel permeation chromatography (GPC) using monodisperse polystyrene as a standard and using GPC columns (manufactured by Tosoh Corp., G2000HXL×2, G3000HXL×1) at a flow rate of 1.0 ml/minute, using tetrahydrofuran as an elution solvent, at a column temperature of 40° C.

Preparation Example 1

Preparation of Resist Composition Solution for ArF

A separable flask equipped with a reflux condenser was charged with 29 parts of 8-methyl-8-t-butoxycarbonyl-methoxycarbonyltetracyclo[$4.4.0.1^{2,5}.1^{7,10}$]dodec-3-ene (monomer (a)), 10 parts of 8-methyl-8-hydroxytetracyclo [$4.4.0.1^{2,5}.1^{7,10}$]dodec-3-ene (monomer (b)), 18 parts of maleic anhydride (monomer (c)), 4 parts of 2,5-dimethyl-2, 5-hexanediol diacrylate, 1 part of t-dodecylmercaptan, 4 parts of azobisisobutyronitrile, and 60 parts of 1,2-diethoxyethane. The mixture was polymerized at 70° C. for six hours while stirring. After the reaction, the reacted solution was poured into a large amount of a mixed solvent of n-hexane and i-propyl alcohol (mass ratio=1:1) to coagulate the resin. The coagulated resin was washed several times with the same mixed solvent and dried under vacuum to obtain a resin containing the following repeating units (a) to (c), which respectively originated from the monomers (a), (b), and (c), at a molar ratio of 64:18:18. The Mw of the resin was 27,00027, 000 (yield was 60%). The molecular weight of the resin was measured by the same method of measuring the molecular weight of the polymers (A-1) to (A-3).

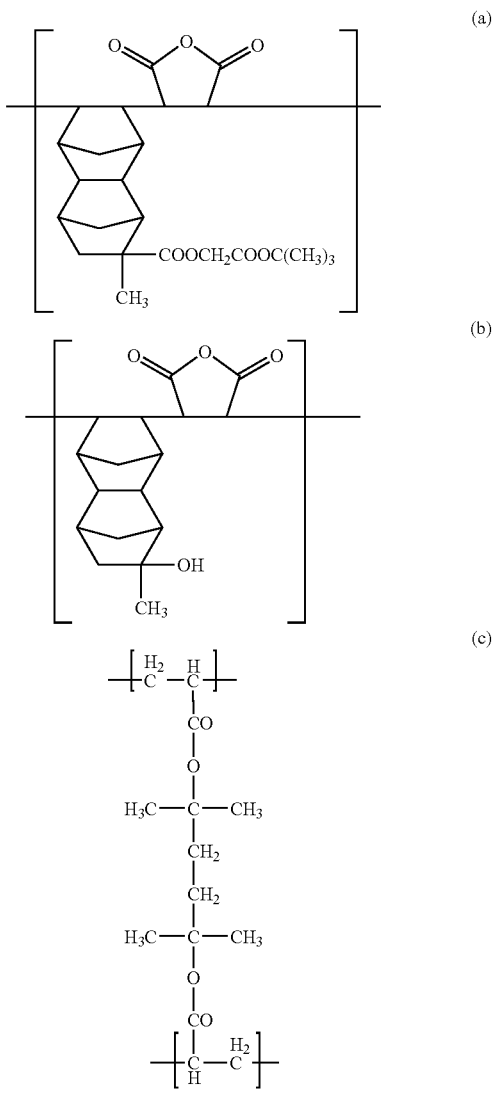

Eighty parts of the above resin, 1.5 parts of 1-(4-methoxynaphthalen-1-yl)tetrahydrothiophenium nonafluoro-n-butanesulfonate, and 0.04 parts of tri-n-octylamine were dissolved in 533 parts of propylene glycol monomethyl ether acetate to obtain a resist composition solution for ArF.

Example 1

Preparation of Composition for Forming a Lower Layer Film

Ten parts of the polymer (A-1), 0.5 parts of bis(4-t-butylphenyl)iodonium nonafluoro-n-butanesulfonate (C-1) as an acid generating agent, and 0.5 parts of tetramethoxymethylglycoluril (D-1) shown by the following formula (D-1) as a cross-linking agent were dissolved in 89 parts of propylene glycol monomethyl acetate. The solution was filtered through a membrane filter with a pore size of 0.1 μm to prepare a composition for forming a lower layer film (I).

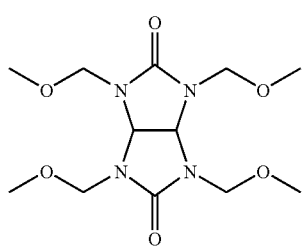

(D-1)

Preparation Method of Sample for Performance Evaluation

A positive-tone resist pattern for ArF was prepared by the following method.

Resist lower layer films with a thickness of 0.3 μm were prepared by applying the composition for forming a lower layer film (I) to a silicon wafer with a diameter of 8" by spin coating and heating the coating for 60 seconds on hot plates at 180° C. and 300° C. After that, an intermediate layer composition solution for three-layer resist process ("NFC SOG080" manufactured by JSR) was spin-coated onto the resist lower layer films and heated on hot plates at 200° C. and 300° C. for 60 seconds to obtain intermediate layer films with a thickness of 0.05 μm. Next, the resist composition solution for ArF obtained in Preparation Example 1 was spin-coated onto the intermediate layer films and prebaked on a hot plate at 130° C. for 90 seconds. The resulting resists were exposed with an ArF excimer laser equipment through a mask pattern for a period equivalent of the optimum exposure time using an ArF excimer laser photolithographic machine manufactured by NIKON Corp. (lens numerical aperture: 0.78, exposure wavelength: 193 nm). After postbaking on a hot plate at 130° C. for 90 seconds, the resist films were developed in a 2.38% tetramethylammonium hydroxide aqueous solution at 25° C. for one minute, washed with water, and dried to form a positive-tone resist pattern for ArF.

The results of performance evaluation using the samples for evaluation (positive-tone resist pattern for ArF) prepared by using the composition for forming a lower layer film (I) of the Example were as follows. The n value and k value of the optical characteristics were respectively 1.43 and 0.52, and the pattern shape, the standing-wave prevention effect, and intermixing prevention effect were good. The etching resistivity (etching rate) was 180 nm/min.

Examples 2 and 3

Preparation of Composition for Forming a Lower Layer Film

The compositions for forming lower layer films (II) and (III) were prepared in the same manner as in Example 1, except that the polymers (A-2) and (A-3), which were synthesized respectively in Synthetic Examples 2 and 3, were used instead of the polymer (A-1) of Example 1. Then, the resist lower film and the samples for performance evaluation (positive-tone resist pattern for ArF) was evaluated in the same manner as in Example 1.

Example 4

Preparation of Composition for Forming a Lower Layer Film

Ten parts of the polymer (A-1) and 1.0 part of bis(4-t-butylphenyl)iodonium nonafluoro-n-butanesulfonate (C-1) as an acid generator were dissolved in 89 parts of propylene glycol monomethyl acetate. The solution was filtered through a membrane filter with a pore size of 0.1 μm to prepare a composition for forming a lower layer film (IV). Then, the resist lower layer film and the samples for performance evaluation (positive-tone resist pattern for ArF) was evaluated in the same manner as in Example 1.

Examples 5 and 6

Preparation of Composition for Forming a Lower Layer Film

The compositions for forming lower layer films (V) and (VI) were prepared in the same manner as in Example 4, except that the polymers (A-2) and (A-3), which were synthesized respectively in Synthetic Examples 2 and 3, were used instead of the polymer (A-1) of Example 4. Then, the resist lower film and the samples for performance evaluation (positive-tone resist pattern for ArF) was evaluated in the same manner as in Example 1.

Example 7

Preparation of Composition for Forming a Lower Layer Film

Ten parts of the polymer (A-1) was dissolved in 89 parts of propylene glycol monomethyl acetate. The solution was filtered through a membrane filter with a pore size of 0.1 μm to prepare a composition for forming a lower layer film (VII). Then, the resist lower layer film and the samples for performance evaluation (positive-tone resist pattern for ArF) was evaluated in the same manner as in Example 1.

Examples 8 and 9

Preparation of Composition for Forming a Lower Layer Film

The compositions for forming lower layer films (VIII) and (IX) were prepared in the same manner as in Example 7, except that the polymers (A-2) and (A-3), which were synthesized respectively in Synthetic Examples 2 and 3, were used instead of the polymer (A-1) of Example 7. Then, the resist lower layer film and the samples for performance evaluation (positive-tone resist pattern for ArF) was evaluated in the same manner as in Example 1.

Example 10

Preparation of Composition for Forming a Lower Layer Film

The composition for forming a lower layer film (X) was prepared in the same manner as in Example 7, except that the polymer (A-3), which was synthesized in Synthetic Example 3, was used instead of the polymer (A-1) of Example 7. Then, the sample for performance evaluation (positive-tone resist pattern for ArF) was prepared and the specified performance was evaluated.

Comparative Example 1

The resist lower layer film and the sample for performance evaluation (positive-tone resist pattern for ArF) were evaluated in the same manner as in Example 1, except for using a phenol novolak resin instead of the composition for forming a lower layer film.

Comparative Example 2

The resist lower layer film and the sample for performance evaluation (positive-tone resist pattern for ArF) were evaluated in the same manner as in Example 4, except for using a phenol novolak resin instead of the composition for forming a lower layer film.

Comparative Example 3

The resist lower layer film and the sample for performance evaluation (positive-tone resist pattern for ArF) were evaluated in the same manner as in Example 7, except for using a phenol novolak resin instead of the composition for forming a lower layer film.

The components and the amounts (parts) used in Examples 1 to 10 and Comparative Examples 1 to 3 are shown in Table 1.

Performance Evaluation Results

The results of evaluation of optical characteristics, pattern shape, standing-wave prevention effect, and intermixing prevention effect in Examples 1 to 10 and Comparative Examples 1 to 3 are shown in Table 2.

TABLE 2

|  |  | Optical characteristics | | Pattern shape | Standing-wave prevention effect | Intermixing prevention effect |
|---|---|---|---|---|---|---|
|  |  | n Value | k Value |  |  |  |
| Example | 1 | 1.43 | 0.52 | Good | Good | Good |
|  | 2 | 1.38 | 0.42 | Good | Good | Good |
|  | 3 | 1.39 | 0.36 | Good | Good | Good |
|  | 4 | 1.41 | 0.52 | Good | Good | Good |
|  | 5 | 1.36 | 0.42 | Good | Good | Good |
|  | 6 | 1.37 | 0.36 | Good | Good | Good |
|  | 7 | 1.40 | 0.50 | Good | Good | Good |
|  | 8 | 1.35 | 0.40 | Good | Good | Good |
|  | 9 | 1.36 | 0.34 | Good | Good | Good |
|  | 10 | 1.36 | 0.34 | Good | Good | Good |
| Comparative Example | 1 | 1.38 | 0.72 | Bad | Bad | Good |
|  | 2 | 1.36 | 0.72 | Bad | Bad | Bad |
|  | 3 | 1.35 | 0.70 | Bad | Bad | Bad |

The results of evaluation of etching resistivity of Examples 1 to 10 and Comparative Examples 1 to 3 are shown in Table 3.

TABLE 3

|  |  | Etching rate (nm/min) |
|---|---|---|
| Example | 1 | 180 |
|  | 2 | 160 |
|  | 3 | 165 |
|  | 4 | 175 |
|  | 5 | 155 |
|  | 6 | 160 |
|  | 7 | 170 |
|  | 8 | 155 |
|  | 9 | 160 |
|  | 10 | 160 |
| Comparative Example | 1 | 230 |
|  | 2 | 225 |
|  | 3 | 220 |

TABLE 1

|  |  | Polymer | Amount (part) | Acid generating agent | Amount (part) | Cross-linking agent | Amount (part) | Solvent |
|---|---|---|---|---|---|---|---|---|
| Example | 1 | A-1 | 10 | C-1 | 0.5 | D-1 | 0.5 | Propylene glycol monomethyl ether acetate |
|  | 2 | A-2 | 10 | C-1 | 0.5 | D-1 | 0.5 | Propylene glycol monomethyl ether acetate |
|  | 3 | A-3 | 10 | C-1 | 0.5 | D-1 | 0.5 | Propylene glycol monomethyl ether acetate |
|  | 4 | A-1 | 10 | C-1 | 1 | — | — | Propylene glycol monomethyl ether acetate |
|  | 5 | A-2 | 10 | C-1 | 1 | — | — | Propylene glycol monomethyl ether acetate |
|  | 6 | A-3 | 10 | C-1 | 1 | — | — | Propylene glycol monomethyl ether acetate |
|  | 7 | A-1 | 10 | — | — | — | — | Ethyl lactate |
|  | 8 | A-2 | 10 | — | — | — | — | Ethyl lactate |
|  | 9 | A-3 | 10 | — | — | — | — | Ethyl lactate |
|  | 10 | A-3 | 10 | — | — | — | — | Propylene glycol monomethyl ether acetate |
| Comparative Example | 1 | Phenol novolak resin | 10 | C-1 | 0.5 | D-1 | 0.5 | Ethyl lactate |
|  | 2 | Phenol novolak resin | 10 | C-1 | 1 | — | — | Ethyl lactate |
|  | 3 | Phenol novolak resin | 10 | — | — | — | — | Ethyl lactate |

INDUSTRIAL APPLICABILITY

The composition for forming a lower layer of the present invention can produce a reflection prevention film exhibiting excellent dry etching resistivity and a high reflection prevention effect, which does not intermix with a resist. The composition is therefore particularly useful for manufacturing a highly integrated circuit.

The invention claimed is:

1. A composition for forming a lower layer film comprising a polymer(A), having a weight average molecular weight (Mw) of 500 to 8,000, and having a naphthalene derivative structural unit shown by the following formula (1),

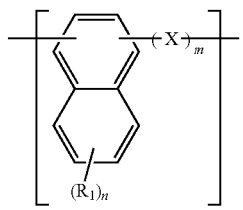

wherein R1 represents a hydroxyl group, a substitutable alkyl group having 1 to 6 carbon atoms, a substitutable alkoxy group having 1 to 6 carbon atoms, a substitutable alkoxycarbonyl group having 2 to 10 carbon atoms, a substitutable aryl group having 6 to 14 carbon atoms, or a substitutable glycidyl ether group having 2 to 6 carbon atoms, n represents an integer from 0 to 6, X represents a methylene group, a substitutable alkylene group having 2 to 20 carbon atoms, a substitutable arylene group having 6 to 14 carbon atoms, or an alkylene ether group, and m represents an integer from 1 to 8, provided that two or more R1s may be the same or different when n is 2 to 6, two or more Xs may be the same or different when m is 2 to 8, and n +m is an integer from 1 to 8.

2. The composition for forming a lower layer film according to claim 1, wherein R1 in the formula (1) has a structure shown by the following formula (2)

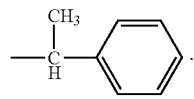

3. The composition for forming a lower layer film according to claim 2, wherein X in the formula (1) has a structure shown by the following formula (3) and/or (4)

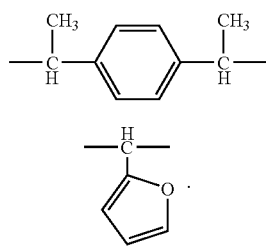

4. The composition for forming a lower layer film according to claim 3, further comprising acid generating agent(C).

5. The composition for forming a lower layer film according to claim 3, further comprising a cross-linking agent(D).

6. The composition for forming a lower layer film according to claim 3, further comprising an additive(B) that prevents intermixing between the resist lower layer film and the resist film.

7. A pattern forming method comprising a step of forming a resist lower layer film by applying a composition for forming a lower layer film a polymer(A), having a weight average molecular weight (Mw) of 500 to 8,000, and having a naphthalene derivative structural unit shown by the following formula (1),

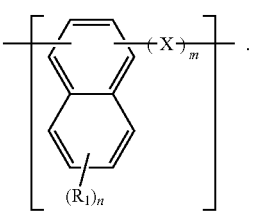

wherein $R_1$ represents a hydroxyl group, a substitutable alkyl group having 1 to 6 carbon atoms, a substitutable alkoxy group having 1 to 6 carbon atoms, a substitutable alkoxycarbonyl group having 2 to 10 carbon atoms, a substitutable aryl group having 6 to 14 carbon atoms, or a substitutable glycidyl ether group having 2 to 6 carbon atoms, n represents an integer from 0 to 6, X represents a methylene group, a substitutable alkylene group having 2 to 20 carbon atoms, a substitutable arylene group having 6 to 14 carbon atoms, or an alkylene ether group, and m represents an integer from 1 to 8, provided that two or more $R_1s$ may be the same or different when n is 2 to 6, two or more Xs may be the same or different when m is 2 to 8, and n +m is an integer from 1 to 8 to a substrate and curing the resulting coating film, a step of forming a resist film by applying a solution of a resist composition to the resist lower layer film and prebaking the resulting coating film, a step of selectively exposing the resist film through a photomask, a step of developing the exposed resist film, and a step of etching the resist lower layer film and the substrate.

8. The pattern forming method according to claim 7, wherein R1 in the formula (1) has a structure shown by the following formula (2)

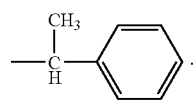

9. The pattern forming method according to claim 7, wherein X in the formula (1) has a structure shown by the following formula (3) and/or (4)

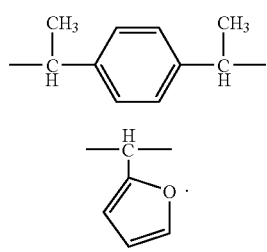

10. The pattern forming method according to claim 7, wherein the composition further comprises an acid generating agent(C).

11. The pattern forming method according to claim 7, wherein the composition further comprising a cross-linking agent(D).

12. The pattern forming method according to claim 7, wherein the composition further comprises an additive(B) that prevents intermixing between the resist lower layer film and the resist film.

* * * * *